United States Patent [19]

Jarick et al.

[11] Patent Number: 5,172,231
[45] Date of Patent: Dec. 15, 1992

[54] S-BAND VIDEO SIGNAL TRANSMITTER
[75] Inventors: James M. Jarick; James Lindsay, both of White Haven, Pa.
[73] Assignee: Electronics Missiles & Communications, Inc., White Haven, Pa.
[21] Appl. No.: 730,454
[22] Filed: Jul. 16, 1991
[51] Int. Cl.⁵ .............................................. H04N 5/38
[52] U.S. Cl. .................................. 358/186; 455/76; 455/109
[58] Field of Search ................. 358/186, 191.1, 193.1, 358/198; 455/103, 109, 118, 120, 76

[56] References Cited
U.S. PATENT DOCUMENTS

| | | | |
|---|---|---|---|
| 4,025,855 | 5/1977 | Atkinson | 455/109 |
| 4,231,116 | 10/1980 | Sekiguchi | 455/118 |
| 4,234,965 | 11/1980 | Bickley | 455/120 |
| 4,296,496 | 10/1981 | Sadler | 455/102 |
| 4,395,776 | 7/1983 | Naito | 455/76 |
| 4,546,387 | 10/1985 | Glaab | 358/186 |
| 4,571,621 | 2/1986 | Dalimonte | 358/186 |
| 4,593,411 | 6/1986 | Schiller | 455/109 |
| 4,631,496 | 12/1986 | Borras | 455/76 |
| 4,777,655 | 10/1988 | Numata | 455/76 |

FOREIGN PATENT DOCUMENTS

0157032  7/1986  Japan.
0001218  1/1988  Japan.

Primary Examiner—James J. Groody
Assistant Examiner—Sherrie Hsia
Attorney, Agent, or Firm—Kane, Dalsimer, Sullivan, Kurucz, Levy, Eisele and Richard

[57] ABSTRACT

An S-Band video transmitter includes a modulator, an up converter for converting the modulated signals to a preselected S-band, and transmit circuitry for transmit circuitry for transmitting the RF signals. The S-band frequency is selected by a synthesizer including a digital phase locked loop in accordance with an input frequency selection signals.

8 Claims, 7 Drawing Sheets

S-BAND VIDEO SIGNAL TRANSMITTER

BACKGROUND OF THE INVENTION

A. Field of Invention

This invention pertains to a transmitter for either composite or separated video signals at a preselected frequency, and more particularly to a transmitter utilizing a phase-locked loop synthesizer in its intermediate stage.

B. Description of the Prior Art

S-Band transmitters presently available are inconvenient because they are relatively large, and complex and require a large power supply. These transmitters typically need three drawers: 1) one for the modulator, 2) one for the up-converter and 3) one for the local oscillator.

Therefore there is a need with for smaller transmitter which requires less space, less power, and has simpler circuitry.

SUMMARY OF THE INVENTION

A video transmitter constructed in accordance with this invention includes modulator means for modulating base band visual and aural signals to an intermediate frequency (IF) and up-converter means for converting IF visual and aural signals to a radio frequency (RF) in accordance with a local oscillator signal. The RF signals are fed to transmit means for transmission. The visual and aural RF signals may be combined in a combiner which is part of the transmit means, or may be processed separately. Synthesizer means are used for generating the local oscillator signal, said synthesizer means including frequency selection means for generating selection signals for selecting the frequency of said local oscillator signal, reference signal oscillator means for generating a reference signal and phase locked loop means for modifying said reference signals in response to said selection signals to generate said local oscillator signal.

BRIEF DESCRIPTION OF THE INVENTION

DETAILED DESCRIPTION OF THE INVENTION

Figure 1:
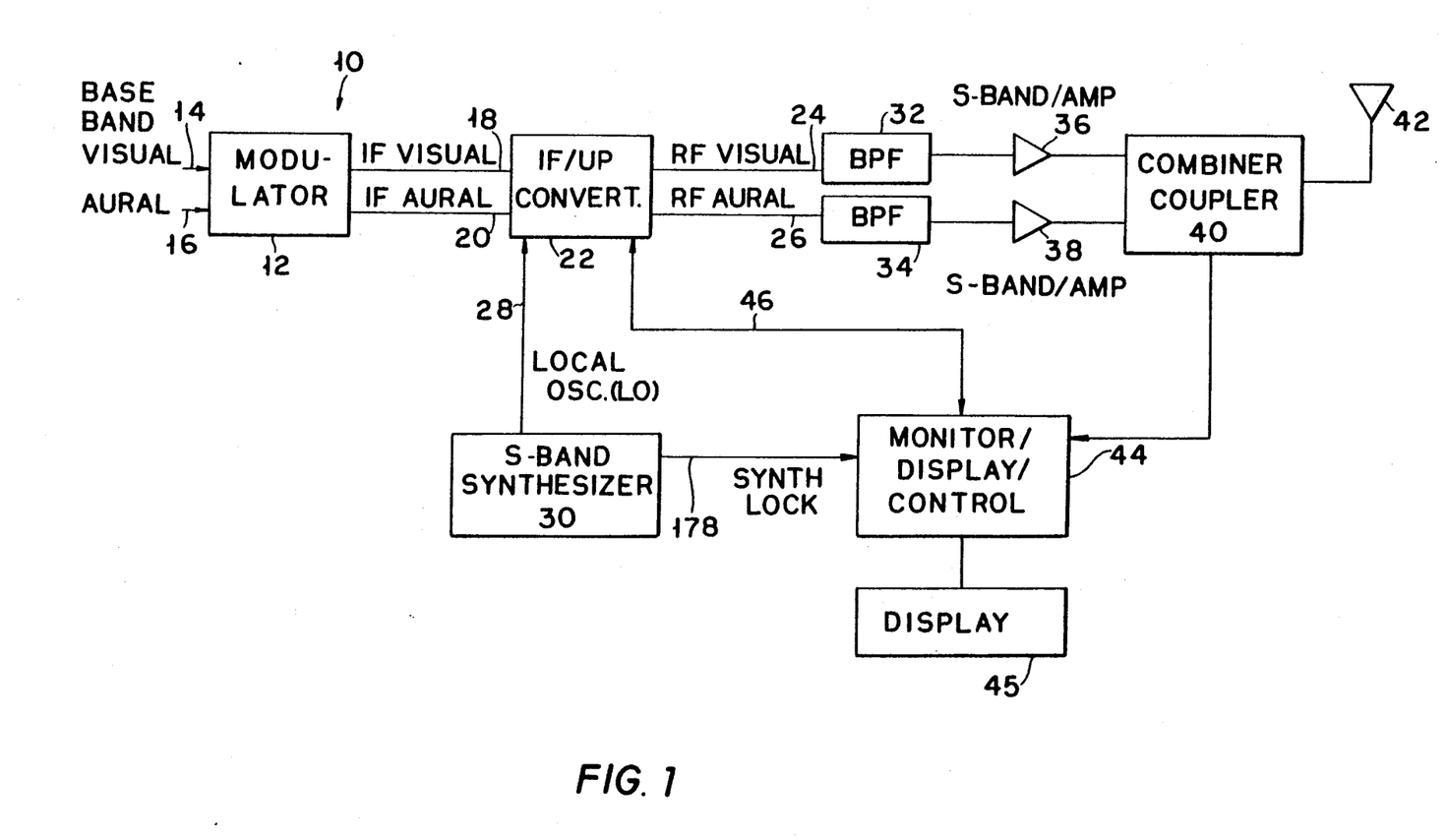
FIG. 1 shows a block diagram of a transmitter constructed in accordance with this invention.

Referring to FIG. 1, a transmitter 10 constructed in accordance with this invention includes a modulator 12 which receives base band visual and aural signals on input lines 14, 16 respectively, and modulates them to generate IF visual and audio signals on output lines 18, 20. Modulators of this type are available from Catel (Models CTM11 or CTM 20) or Scientific Atlanta (Model 6350).

The IF visual and aural signals on lines 18, 20 are fed to an IF up-converter stage 22 which converts these signals to corresponding RF signals in the S-Band range on lines 24, 26. The carrier frequencies of these signals are determined by a local oscillator signal (LO) received by up-converter 22 on line 28 from an S-Band synthesizer 30. The frequency of the oscillator signal is manually selectable as described more fully below, and is in the range of 2.5 to 2.8 GHz.

The RF visual and aural signals are fed through band pass filters 32, 34 respectively, and then amplified by amplifier stages 36, 38. For a transmitter with a relatively low output, i.e. in the range of 10 W peak visual and 1 W average aural, the two RF signals are then combined in a combiner/coupler 40 and then transmitted through an antenna 42. For higher power outputs a different coupling arrangement may be used.

The status of the transmitter is monitored by a control device 44 and displayed on display 45. Device 44 interfaces with the up-converter 22 and the combiner coupler 40 and produces visual indication of average and peak power levels of the output RF signals, the status of the up-converter, etc. Device 44 may also provide AGC signals to the up-converter, and may include various diagnostic circuits and display means, to assist technicians in trouble shooting.

This invention concerns the structure and operation of the S-Band synthesizer 30.

Figure 2:
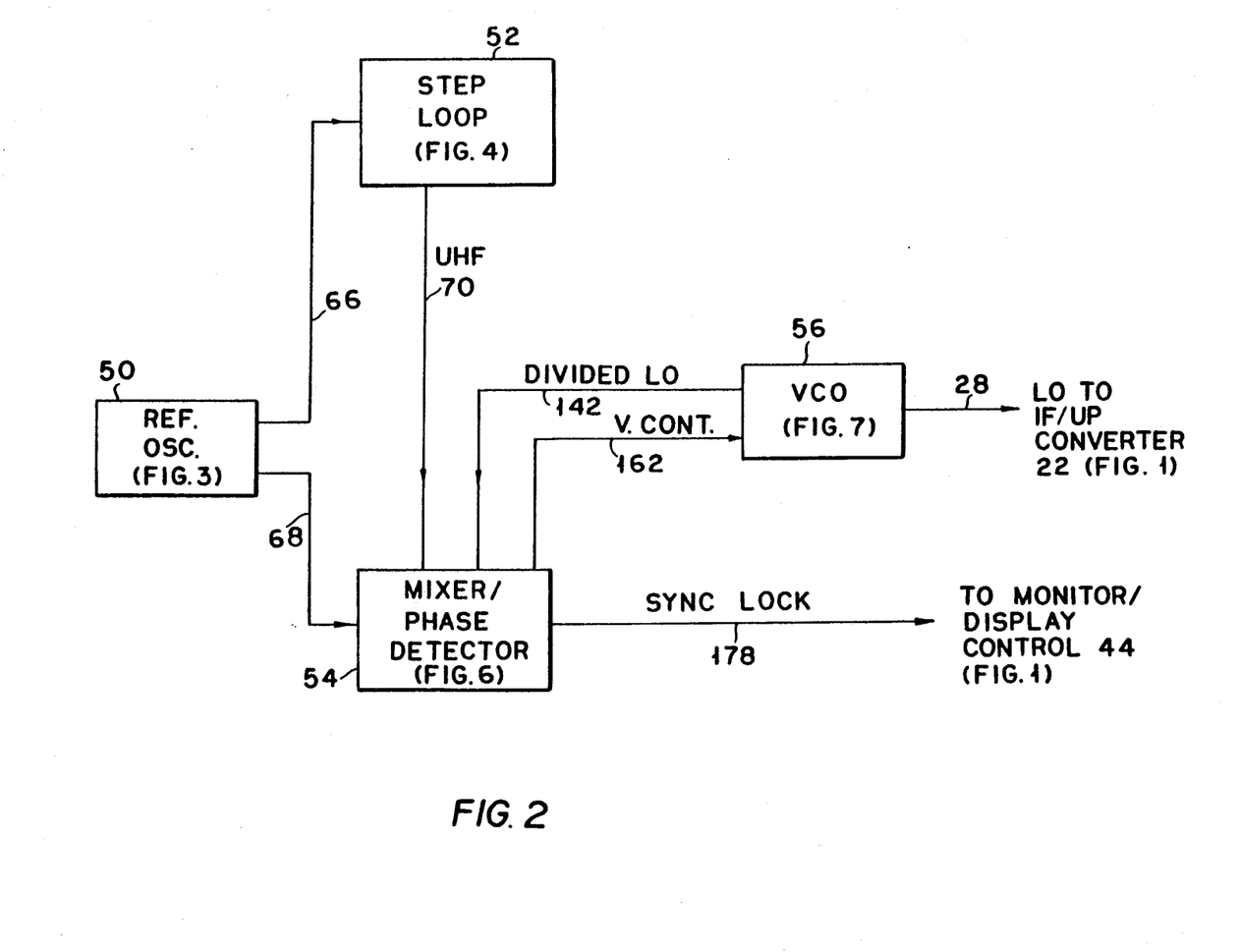
FIG. 2 shows a block diagram of the synthesizer for the transmitter of FIG. 1.

As mentioned above the purpose of the S-Band Synthesizer 30 is to develop a programmable local oscillator (LO) signal for the IF/Up-converter (22) in order to upconvert the visual and aural IF carriers to S-band frequencies. The frequency of the LO signal is the sum of the visual IF carrier and the visual S-band carrier associated with a specific S-band channel. The S-Band Synthesizer consists of four modules as shown in FIG. 2: a reference oscillator (50); a step loop (52), a mixer/phase detector (54) and voltage controlled oscillator (VCO, 56).

Figure 3:
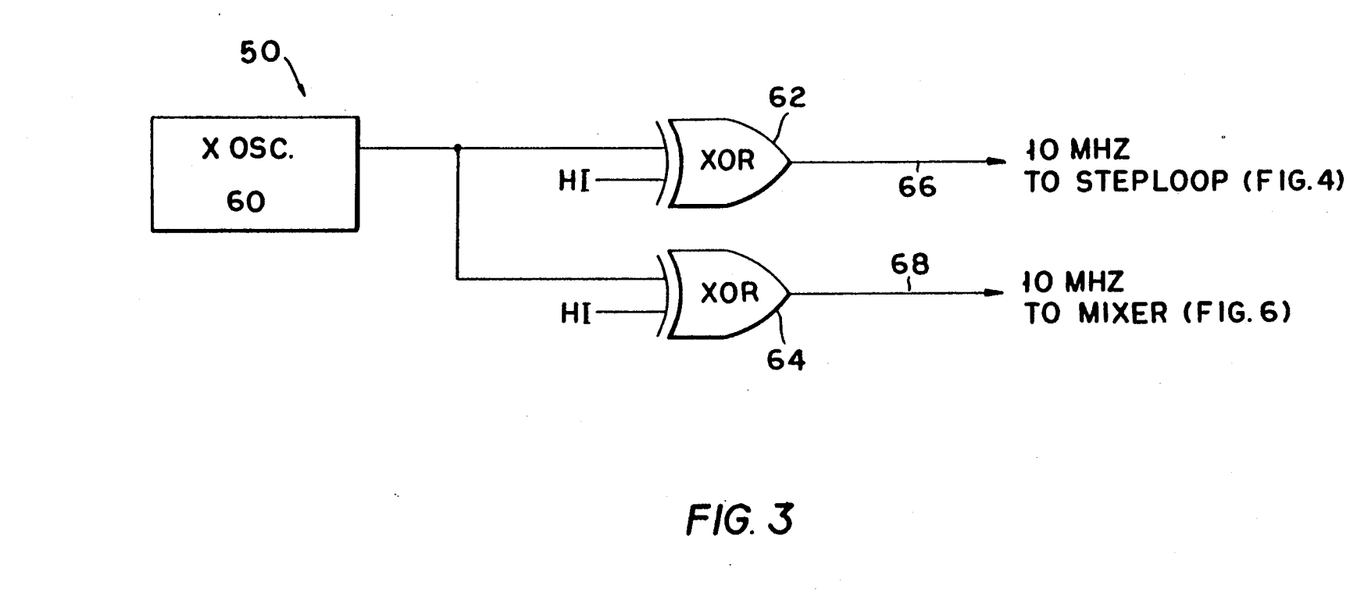
FIG. 3 shows details of the reference oscillator for the synthesizer of FIG. 2.

The function of the reference oscillator module 50, is to provide a 10 MHz reference signal for both the step loop 52 and mixer/phase detector 54 modules. As shown in FIG. 3, the reference oscillator includes a 10 MHz temperature-compensated crystal oscillator 60. The output from oscillator 60 is applied to two exclusive-OR gates 62, 64 which are used as inverting buffers. The output signals from each gate are low-level, TTL-compatible square wave signals with a frequency of 10 MHz delivered on lines 66 and 68.

The step loop module 52 (FIG. 2) uses the 10 MHz reference signal on line 66 from the reference oscillator module 50 and provides a UHF signal on output line 70 which is used to drive the LO port of the mixer in the mixer/phase detector module 54. The step loop module 50 is comprised of six stages.

The first stage (FIG. 4) is a decade counter/divider 72, which divides by five the 10 MHz reference signal from line 66. The resulting 2 MHz reference signal is applied to the second stage on line 74.

Figure 5:
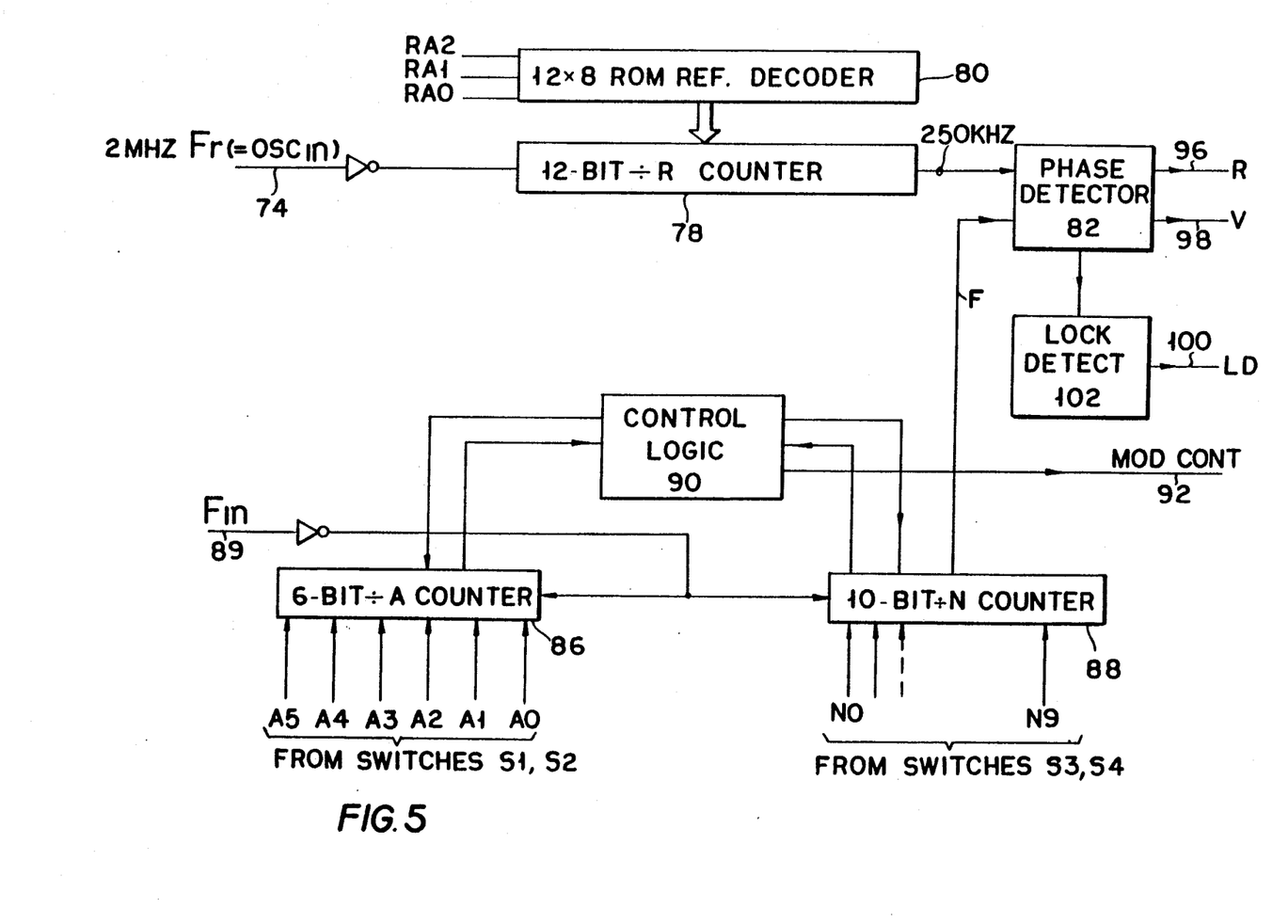
FIG. 5 shows details of the phase locked loop of the step loop of FIG. 4.

The second stage consists of a parallel-input PLL frequency synthesizer 76 and four, 2-pole, 16-position switches (S1 to S4). The block diagram of synthesizer 76 is shown in FIG. 5. This circuit is available as an IC chip for example from Motorola under the designation MC145152P2.

Figure 4:
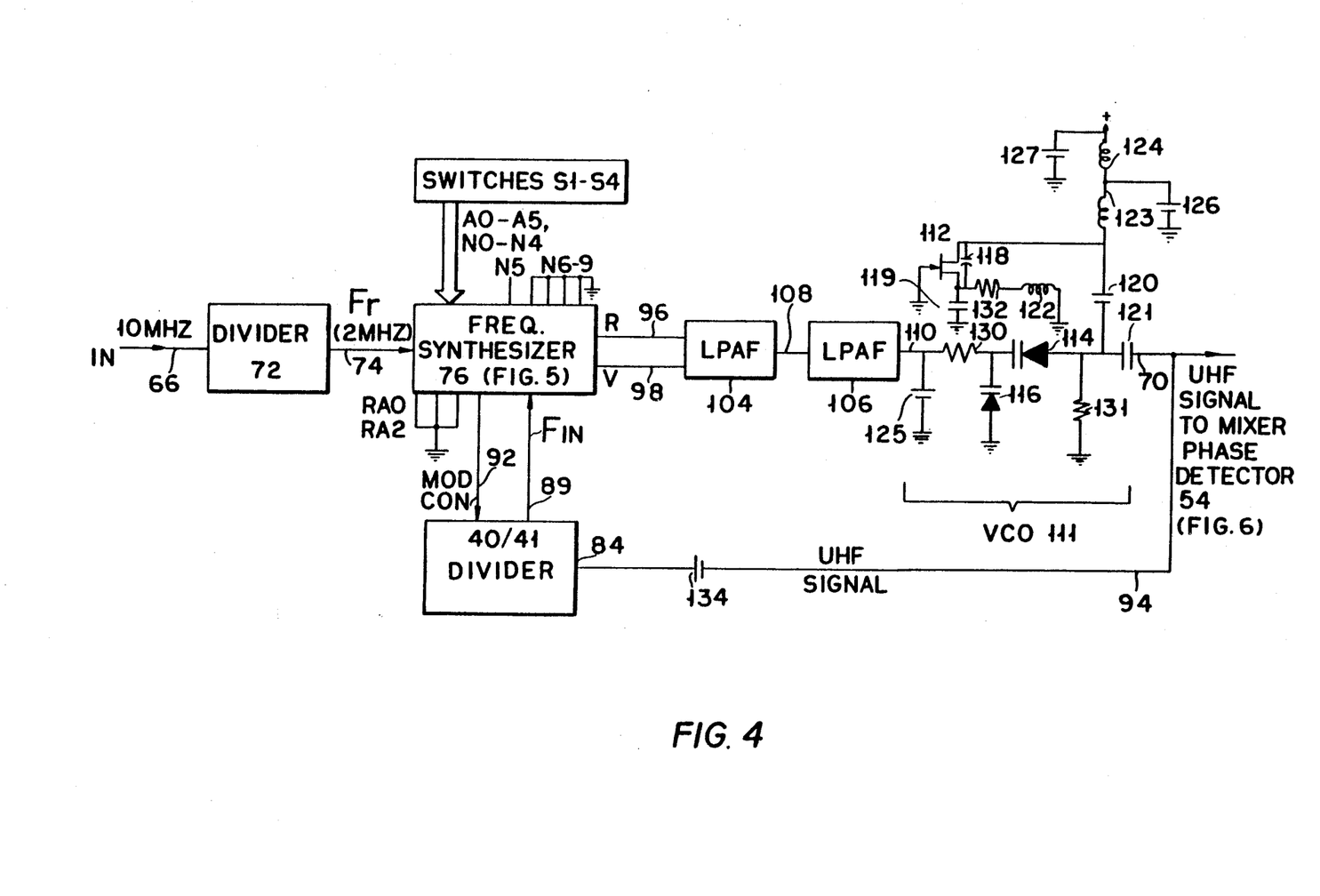
FIG. 4 shows details of the step loop for the synthesizer of FIG. 2.

In FIG. 5, the frequency input line designated $OSC_{in}$ is driven by the 2 MHz reference signal from divider 72. This signal is divided by a 12-bit divide-by-R counter 78. The value of R may be selected from a 12×8 ROM decoder 80 using an address on input lines RA0-RA2. In this application, the three reference address lines RA0-RA2 are tied to ground (as shown in FIG. 4) thereby programming the divide-by-R counter to divide the 2 MHz reference signal by eight. The resulting 250 kHz reference signal is fed into the phase detector 82.

The frequency input line designated Fin is driven by a divided UHF signal from the ÷40/41 dual modulus divider 84 (FIG. 4) as described below. The Fin signal is further divided by a 6-bit divide-by-A counter 86 and a 10-bit divide-by-N counter 88. The resulting signal is then fed to the phase detector 82 for comparison with the 250kHz reference signal from the divide-by-R counter 78. The operation of counters 86, 88 is controlled by Control Logic circuit 90. The divide-by-A counter 86 and the divide-by-N counter 88 are programmed by the data applied to the A input lines (A0 TO a5) and the n input lines (N0-N9), respectively. The A input lines define the number of clock cycles of the divided UHF signal applied to Fin that require a logic 0 on the modulus control line of phase lock loop synthesizer 76. In this application, lines A0 through A3 are controlled by switch S1 while lines A4 and A5 are controlled by switch S2. The N input lines provide the data that is pre-set into the divide-by-N counter when it reaches the count of zero. In this application, lines N0 through N3 are controlled by switch S3, and line N4 is controlled by switch S4. As shown in FIG. 4, line N5 is left open (i.e., logic 1), and lines N6 through N9 are connected to ground (i.e., logic 0). The data programmed into the divide-by-A and divide-by-N counters is controlled by the setting of switches S1 through S4. The setting of these switches determines LO frequency corresponding to the visual and aural S-band carriers of a specific channel. The relationship between the data programmed into the divide-by-A and divide-by-N counters 86, 88 and the resulting UHF frequency for a given LO frequency is given by the following equation:

$$A + (N)(P) = \frac{\text{UHF Frequency}}{\text{Ref. Frequency into Phase Detector}}$$

where, $N \geq A$ $A$ = data in decimal programmed into the divide-by-$A$ counter 86

$N$ = data in decimal programmed into the divide-by-$N$ counter 88

$P$ = the lower selectable divide ratio of the +40/41 dual modulus divider (i.e., 40)

$$\text{UHF Frequency} = \frac{\text{LO Frequency}}{4} - 200 \text{ MHz}$$

Reference Frequency into Phase Detector = 250 kHz

The modulus control line designated MOD CONT on line 92 is used to program the modulus control input of the ÷40/41 dual modulus divider 84, described below. The MOD CONT line is low at the beginning of a count cycle and remains low until the divide-by-A counter 86 has counted down from its programmed value. When the divide-by-A counter 86 reaches a count of zero, the MOD CONT line 92 goes high and remains high until the divide-by-N counter 88 has counted the rest of the way down from its programmed value. When the divide-by-N counter reaches a count of zero, the MOD CONT line 92 is set low, both counters are pre-set to their respective programmed values, and the count cycle sequence is repeated. The phase detector output signals on output lines 96, 98 are designated R and V. The signals on two output lines are the result of the phase detector comparing the 250 kHz reference signal (Fr) from the divide-by-R counter 78 with the divided UHF signal F from the divide-by-N counter 88. If the frequency of F is greater than the frequency of Fr or if the phase of F is leading, then error information is provided by signal V pulsing low, while signal R remains essentially high. If the frequency of Fin is less than the frequency of Fr signal or if the phase of Fr is lagging, then error information is provided by signal Fr pulsing low, while signal V remains essentially high. If the frequency of F is equal to the frequency of Fr and both are in phase, then both signals V and R remain high except for a small minimum time period when both pulse low in phase. The lock detect output line 100 designated LD from lock detector 102 is used to indicate when the loop is locked (i.e., when the frequency of F is equal to the frequency of Fr and both are in phase). A high is placed on the LD line when the loop is locked. However, when the loop is out of lock, the LD line goes low.

The third stage of the step loop 52 is a low-pass active filter 104 with a high dc gain and a bandwidth of 10 kHz. This filter is the primary filter of the step loop since it controls the loop's performance. The purpose of this stage is to produce a loop error signal by integrating the signals R,V on output lines 96, 98. When the divided UHF signal is locked to the 250 kHz reference signal Fr, the loop error signal from this stage will be a dc voltage with spurs at 250 kHz. However, when the loop is out of lock, the loop error signal will be a pulse riding on a dc offset.

The fourth stage is a second-order, low-pass active filter 106 with a dc voltage gain of IV/V and a bandwidth of 100 kHz. This filter is the secondary filter stage of the loop step and its purpose is to suppress the 250 kHz spurs in the loop error signal on line 108 from the primary filter stage when the loop is locked. The output signal from this stage is a dc voltage on line 110 which is used to control the frequency of the VCO stage 111.

The fifth stage is the voltage control oscillator 111 consisting of transistor 112, varactor diodes 114 and 116 and the passive components coupled thereto. The frequency determining components include varactors 114, 116, and capacitors 118 and 119. Capacitors 120, 121 are used for coupling. Inductors 122, 123 and 124 serve as RF chokes, and capacitors 125, 126 and 127 provide bypassing. Resistors 130-132 are used to bias the active components of this stage. The level of the dc control voltage used to bias varactors 114, 116 determines their capacitance. An increase in the dc control voltage reduces the capacitance of the varactors which increases the VCO's frequency of oscillation. Coupling capacitor 120 provides dc blocking so that the dc control voltage used to bias the varactors has no effect on the bias of transistor 112. When the loop is locked, the output signal from this stage is a UHF signal on line 70 with a power level of approximately +9dBm. Switches S1 through S4 provide a means of stepping the frequency of this UHF signal in increments of 250 kHz. The output signal from the VCO stage is used to drive the LO port of the mixer in the Mixer/phase detector module described below. A sample of this UHF output signal is taken by the sixth stage.

The sixth stage is the ÷40/41 dual modulus divider 84. The module samples the UHF signal generated by the VCO stage. This sample is ac-coupled via capacitor 134 to the input of module 84 which divides the sampled UHF signal by either 40 or 41. The magnitude of the division is determined by the logic level applied to the modulus control input from line 92. When a logic 1 is applied on this input, module 84 is programmed to divide the sampled UHF signal by 40. However, when a logic O is applied, module 84 divides the sampled UHF signal by 41. The divided UHF module 84 signal from module 84 is the Fin input of module 76.

The mixer/phase detector module 54 (FIG. 6) also uses the 10 MHz reference signal on line 68 from the reference oscillator 50, as well as the UHF signal on line 70 from the step loop 52 and a sample of the divided LO signal on line 142 from the VCO 56. The output signals from this module include a SYNTH LOCK voltage level used by the monitor/control module 44 and a dc control voltage used by the VCO module 56. The mixer/phase detector module consists of eight stages.

Figure 6:
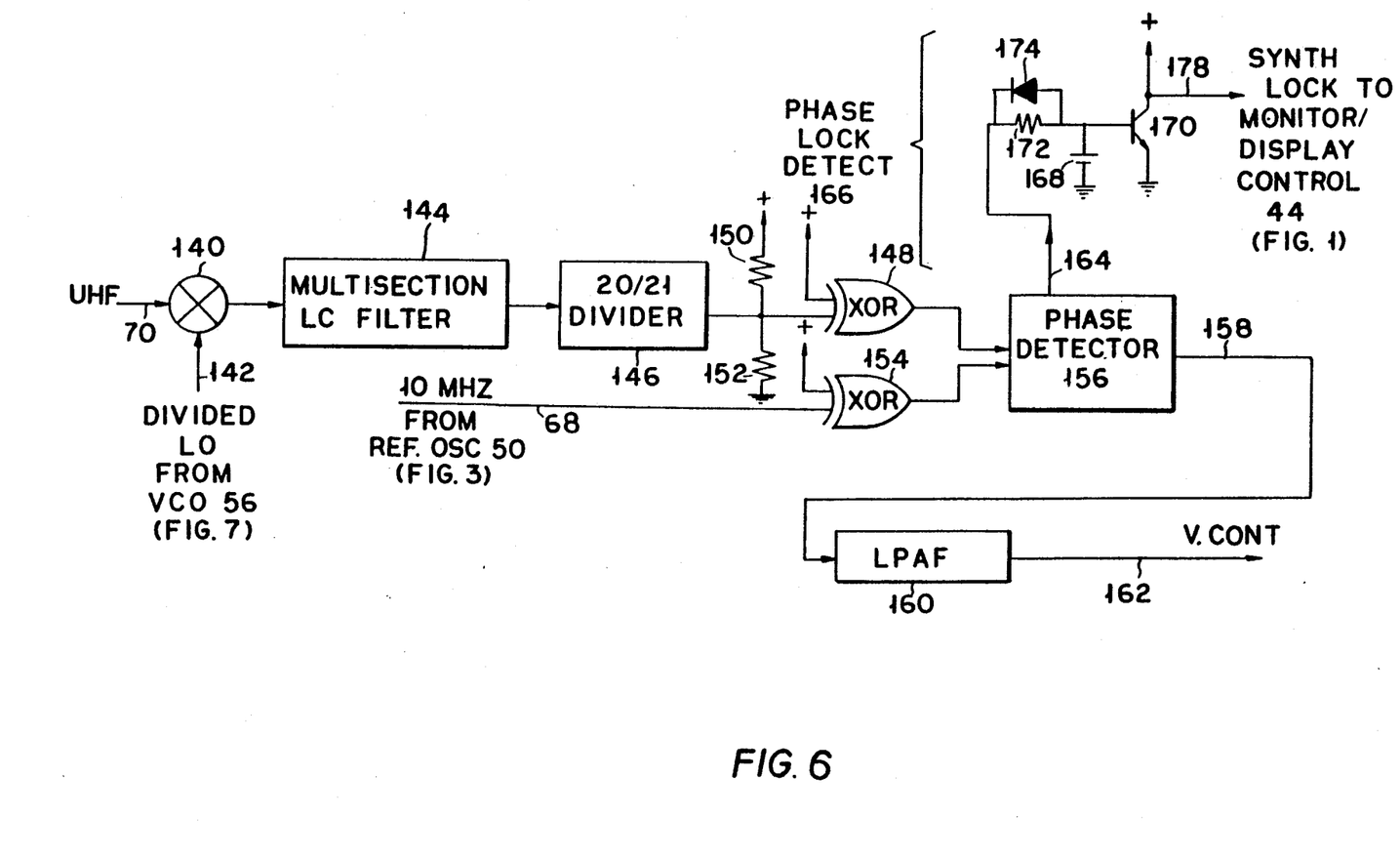
FIG. 6 shows details of the mixer/phase detector for the synthesizer of FIG. 2.

The first stage is a mixer 140 which is used to downconvert the divided LO signal from the VCO module 56 on line 142 to an IF signal of 200 MHz when the S-Band Synthesizer is phase-locked. The other port of mixer 140 is driven by the UHF signal on line 70 from the step loop module. The conversion loss of this stage is typically 7dB.

The second stage is a multi-section, low pass L-C filter 144. This filter is used to select the 200 MHz IF signal located in the lower sideband of output from mixer 140. The insertion loss of this filter at 200 MHz is approximately 1 dB.

The third stage is a ÷20/21 dual modulus divider 146. Divider 146 is programmed to divide the signal applied to its input by 20 since its control input is tied high. Therefore, when the S-Band Synthesizer is locked, the frequency of the output signal from this stage will be 10 MHz.

The fourth stage consists of two Exclusive-OR (XOR) gate 148. Resistors 150, 152 add a dc offset to the output signal from divider 146. The exclusive-OR gate 148 functions as an inverting buffer.

The fifth stage is driven by one of the 10 MHz reference signals from the reference oscillator module 50 (FIG. 3). This stage consists of an exclusive-OR gate 154. This gate also functions as an inverting buffer.

The sixth stage is a phase detector 156. Preferably, detector 156 is an IC such as a 74HC4046 made by National Semiconductor. This stage compares the divided and processed LO signal from the fourth stage (XOR gate 148) with the processed 10 MHz reference signal from the fifth stage (XOR gate 154). When the frequency and phase of these two signals are equal, the S-Band Synthesizer is locked. This condition results in a dc voltage of +2.5 Vdc with small spurs at 10 MHz on the output line 158.

The seventh stage is a low-pass active filter 160 with a high dc gain and a bandwidth of 30 kHz. This stage functions as a loop filter. The purpose of this stage is to produce a loop error signal by integrating the signal from line 158. When the divided and processed LO signal is locked to the processed 10 MHz reference signal, the loop error signal from this stage will be a dc control voltage in the range of +2 to +12 Vdc. This signal is applied to V.CONT line 162.

Phase detector 156 has a second output on line 164 which is high when the S-Band Synthesizer is locked.

The eighth stage is a phase lock detector circuit 166. When the S-Band Synthesizer is locked, the high output from line 164 charges capacitor 168 to a level which causes transistor 170 to saturate. This condition results in a logic low applied to the module's SYNTH LOCK line. However, when the S-Band Synthesizer is not locked, the ac voltage from line 164 slowly begins to charge capacitor 168 through resistor 172 and capacitor 168 is quickly discharged through diode 174. As a result, capacitor 168 is kept from charging to the level that causes transistor 170 to turn on. Therefore, with transistor 170 off, a logic high is applied to the module's SYNTH LOCK line when the S-Band Synthesizer is out of lock.

The VCO module 56 (FIG. 7) uses the dc control voltage (V.CONT) from the mixer/phase detector module 54 (FIG. 6) and provides a LO signal for the IF/upconverter 22 (FIG. 1) and a divided LO signal for the input port of the mixer 140 in the mixer/phase detector module 54. The VCO module 56 consists of three stages.

Figure 7:
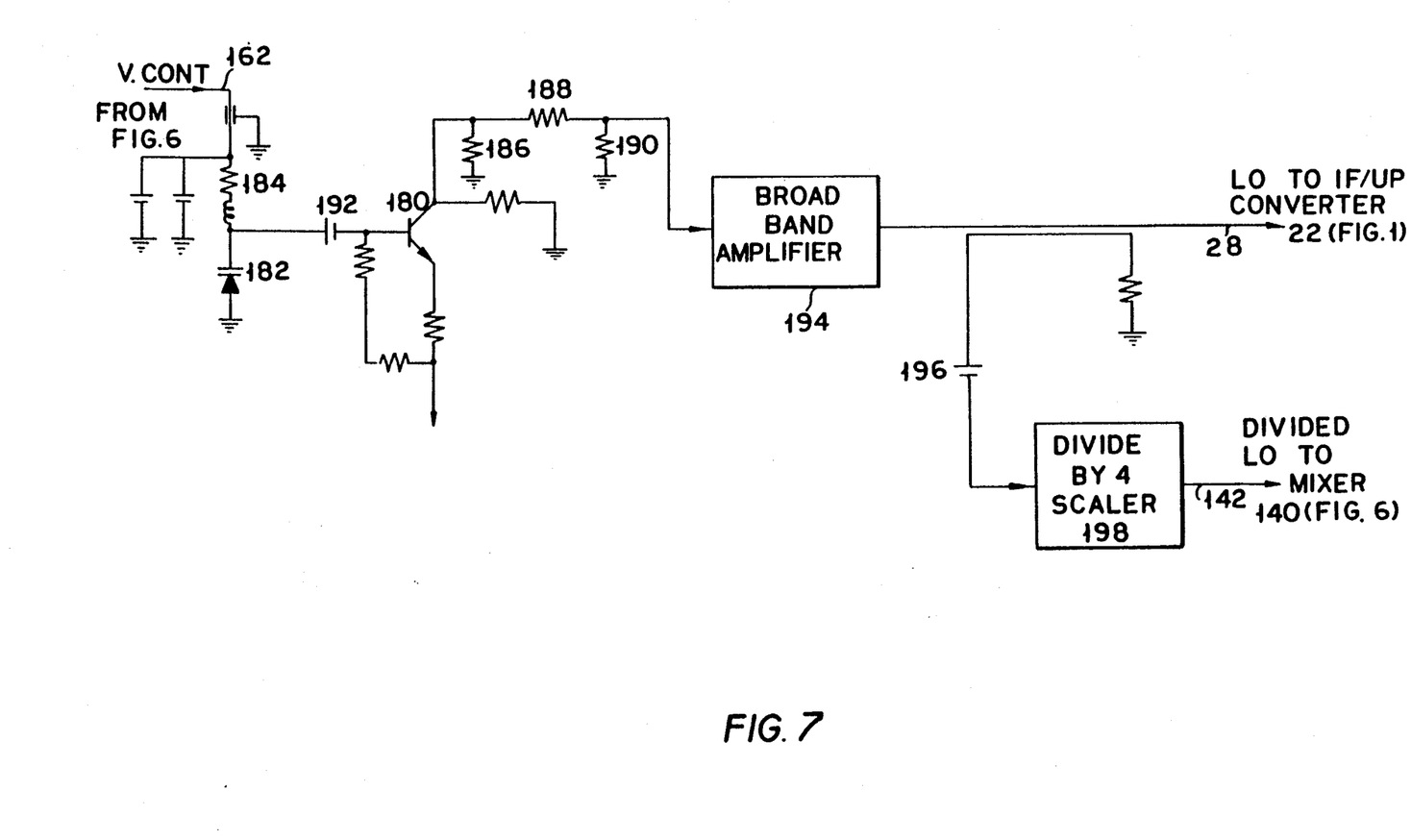
FIG. 7 shows details of the voltage controlled oscillator for the synthesizer of FIG. 2.

The first stage is the VCO itself consisting of a transistor 180, varactor 182, and other passive components. Resistor 184 is used to bias varactor 182. Resistors 186, 188, 190 form a 4 dB pad which provides some isolation between the VCO stage and the second stage. The frequency of the VCO is determined by components 182, 192. Capacitor 192 also functions as a dc block so that the dc control voltage used to bias varactor 182 doesn't influence the bias of transistor 180. When the S-Band Synthesizer is phase-locked, the output signal from this stage is an LO signal with a minimum power level of +2 dBm.

The second stage is a broadband amplifier 194. Amplifier 194 provides at least 8 dB of gain to the signal from the VCO stage. The LO signal from this stage is applied to the module's LO output line 28.

The third stage consists of a divide-by-4 scaler 198. A sample of the LO signal is taken and ac-coupled via capacitor 196 to the inputs of scaler 198. The sampled LO signal is divided by four. The output at scaler 198 is sent as the DIVIDED LO signal to the mixer 140 (FIG. 6) on line 142.

Thus the S-Band synthesizer 30 is used to select the carrier frequency and S-Band channel for the transmission of the video signals. Importantly, the modules shown in FIG. 1 can now be packaged into two drawers. Previous transmitters required three drawers. Thus the present transmitter design results in substantial savings in power, size and cost.

Obviously numerous modifications may be made to the invention without departing from its scope as defined in the appended claims.

We claim:

1. A video transmitter for sending out video signals, said video transmitter comprising:
   modulator means for modulating base band visual and aural signals to separate IF visual and aural signals;
   up-converter means for converting said separate IF visual and aural signals to separate RF visual and aural signals in accordance with a local oscillator signal;
   transmit means including combiner means for combining said RF visual and aural signals into RF composite video signals, said transmit means being provided for transmitting said RF composite video signals; and synthesizer means for generating said local oscillator signal, said synthesizer means including frequency selection means for generating selection signals for selecting the frequency of said local oscillator signal, reference signal oscillator means for generating a reference signal and phase locked loop means for modifying said reference signal in response to said selection signals to generate said local oscillator signal.

2. The transmitter of claim 1 wherein said transmit means includes filter means for filtering RF signals from said up-converter means.

3. An S-Band video transmitter for sending out video signals, in the S-Band range, said video transmitter comprising:

modulator means for modulating base band visual and aural signals to separate IF visual and aural signals;

up-converter means for converting said IF visual and aural signals to separate RF visual and aural signals in accordance with a local oscillator signal;

combiner/transmit means for combining said separate RF visual and aural signals into a combined RF video signal, and transmitting said RF video signal; and synthesizer means including reference oscillator means for generating a reference signal; step loop means receiving said reference signal and including frequency selection means for generating selection signals for selecting the frequency of said local oscillator signal, frequency synthesizer means for modifying said reference signal in response to said selection signals to generate a UHF signal by modifying said reference signal in accordance with said selection signals; phase detector means for generating a voltage control signal corresponding to said reference signal and said UHF signal; and voltage control oscillator means for generating said local oscillator signal corresponding to said voltage control signal.

4. The transmitter of claim 3 further comprising monitoring means for displaying status information.

5. The transmitter of claim 4 wherein said phase detector means further generates a phase lock signal to indicate that the local oscillator signal has been phase-locked, said phase lock signal being transmitted to said monitoring means.

6. The transmitter of claim 3 wherein said selection means comprises manually operated switches.

7. The transmitter of claim 3 wherein said step loop means further includes a first frequency divider for dividing said reference signal by a first preset constant, a second frequency divider programmable to divide said UHF signal by one of a second and a third preset constants, phase-lock loop means coupled to said frequency selection means, and said dividers for driving a generator, said generator generating said UHF signal.

8. The transmitter of claim 3 wherein said phase detector means includes mixer means coupled to said UHF signal and said voltage controlled oscillator to generate a mixed signal, and phase comparator means for comparing the phases of said mixed signal and said reference signal.

* * * * *